United States Patent
Aoshima et al.

[11] Patent Number: 6,010,781
[45] Date of Patent: Jan. 4, 2000

[54] MAGNETORESISTANCE EFFECT ELEMENT, MAGNETORESISTANCE EFFECT TYPE HEAD AND MAGNETIC RECORDING/REPRODUCING APPARATUS

[75] Inventors: Kenichi Aoshima; Hitoshi Kanai, both of Kawasaki, Japan

[73] Assignee: Fujitsu Limited, Kawasaki, Japan

[21] Appl. No.: 09/007,151

[22] Filed: Jan. 15, 1998

[30] Foreign Application Priority Data

Sep. 18, 1997 [JP] Japan .................................. 9-253832

[51] Int. Cl.[7] ........................................................ G11B 5/66
[52] U.S. Cl. ........................ 428/332; 428/336; 428/692; 428/694 T; 428/694 R; 428/900; 360/113; 324/252
[58] Field of Search .................................. 428/692, 694 T, 428/694 R, 900, 336, 332; 360/113; 324/252

[56] References Cited

U.S. PATENT DOCUMENTS

| | | | |
|---|---|---|---|
| 5,287,237 | 2/1994 | Kitada | 360/113 |
| 5,549,978 | 8/1996 | Iwasaki | 428/692 |
| 5,691,864 | 11/1997 | Saito | 360/113 |

FOREIGN PATENT DOCUMENTS 09069211 3/1997 Japan .

*Primary Examiner*—Leszek Kiliman
*Attorney, Agent, or Firm*—Greer, Burns & Crain, Ltd.

[57] ABSTRACT

A magnetoresistance effect element exhibiting superb magnetic characteristics and anticorrosion characteristic is disclosed. The magnetoresistance effect element includes an antiferromagnetic layer composed of a material made of Ir, Rh and Mn in which an Ir content percentage is 2–6% by atom and a Mn content percentage is 71–78% by atom, or a material in which the Ir content percentage is 2–12% by atom and the Mn content percentage is 78–84% by atom.

7 Claims, 7 Drawing Sheets

FIG. 1

| Ta | (10 nm) | ~25 |
| IrRhMn | (6~25 nm) | ~24 |
| CoFeB | (2.1 nm) | ~23 |
| NiFe | (7.0 nm) | ~22 |
| Ta | (5.0 nm) | ~21 |
| SUBSTRATE | | ~20 |

MAGNETORESISTANCE EFFECT ELEMENT, MAGNETORESISTANCE EFFECT TYPE HEAD AND MAGNETIC RECORDING/REPRODUCING APPARATUS

BACKGROUND OF THE INVENTION

1. Field of the Invention

The present invention relates to a magnetoresistance effect element, a magnetoresistance effect type head and a magnetic recording/reproducing apparatus and, more particularly, to a magnetoresistance effect element containing an antiferromagnetic layer, a magnetoresistance effect type head using such a magnetoresistance effect element and a magnetic recording/reproducing apparatus using also the same element.

2. Description of the Related Art

Some of magnetoresistance effect elements used for a magnetoresistance effect type head include an antiferromagnetic layer that exhibits exchange coupling with a magnetic layer.

Figure 10:
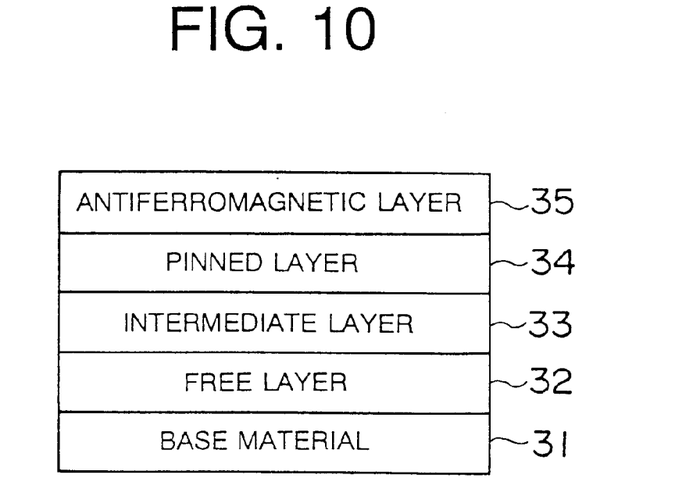
FIG. 10 is an explanatory diagram of a spin valve element.

FIG. 10 shows a structure of a spin valve element (a sensor device of a spin valve head) defined as one of the element described above. As shown in FIG. 10, the spin valve element has such a configuration that a free layer 32, an intermediate layer 33, a pinned layer 34 and an antiferromagnetic layer 35 are laminated on a base material 31. Among those layers, the free layer 32 and the pinned layer 34 are composed of a ferromagnetic material (normally, NiFe (Nickel/Iron) alloy; Permalloy) exhibiting a small anisotropic magnetic field, and the intermediate layer 33 is formed by use of a non-magnetic metal such as Cu (copper). Then, the antiferromagnetic layer 35 involves the use of a layer composed of an antiferromagnetic material which proudes a strong exchange coupling with the pinned layer 34 by its coming into tight contact at an atomic level with the pinned layer 34. The exchange coupling provides the spin valve element with an excellent magnetic field detecting characteristic.

Known also is a magnetoresistance effect element including a single magnetic layer and the antiferromagnetic layer.

It is taken for granted that the material for forming the antiferromagnetic layer of the magnetoresistance effect element having the construction described above is required to produce the strong exchange coupling with the magnetic layer (to increase a coupling magnetic field between the magnetic layer and the antiferromagnetic layer to be formed). In addition, the above material is required to exhibit a high anticorrosion and a high thermal stability as well as to be easy to form the antiferromagnetic layer.

The materials (FeMn, IrMn, RhMn, NiO, NiMn, PtMn etc) hitherto used for forming the antiferromagnetic layer have defects in some points in terms of serving as the materials for the antiferromagnetic layer. For example, NiMn and PtMn do not exhibit a desired characteristic in an as-layer-formed state. Therefore, in the case of using those materials, it is required that a thermal treatment be effected at a high temperature (approximately 300° C.) after forming the layers. As a result, there arises a problem in which a manufacturing process of the magnetoresistance effect element becomes intricate, and the magnetoresistance effect element exhibiting a uniform characteristic is hard to obtain. Further, NiO exhibits the antiferromagnetic characteristic in the as-layer-formed state and also possesses a high anticorrosion characteristic but is poor in terms of the thermal stability. Another problem inherent in NiO is that a NiO layer exhibits, when being formed thinly, small coupling magnetic field with respect to the magnetic layer.

FeMn, IrMn and RhMn exhibit the antiferromagnetic characteristic in the as-layer-formed state and a comparatively high thermal stability as well, but presents such a problem that the anticorrosion in a composition for producing the strong exchange coupling with a ferromagnetic layer is poor. Hence, according to a technology disclosed in, e.g., Japanese Patent Application Laid-Open Publication No. 8-249616, when forming the antiferromagnetic layer of the spin valve element, there is used an IrMn binary antiferromagnetic material having such a composition (a percentage content of Ir is 30–45% by atom) that the coupling magnetic field to a NiFe magnetic layer is approximately ½of the maximum coupling magnetic field that can be actualized by the IrMn binary system antiferromagnetic material.

Further, according to the above Publication, although a magnitude of the coupling magnetic field obtained is reduced by adding Pt, Ru and Rh to IrMn, it is reported that the anticorrosion can be enhanced. To be specific, it is reported that when d=5 in the antiferromagnetic material expressed by $(Mn_{60}Ir_{40})_{100-d}Pt_d$ (the suffix represents % by atom), though the coupling magnetic field becomes smaller than $Mn_{60}Ir_{40}$, it exhibits a more excellent anticorrosion than the anticorrosion $Mn_{60}Ir_{40}$. Then, the same result is to be obtained by use of Ru, Rh in place of Ir.

Thus, according to the technology disclosed in this Publication, the ternary alloy acquired by adding a third element to the IrMn binary alloy in order to enhance the anticorrosion. As a result of being the ternary alloy, however, the coupling magnetic field decreases. Consequently, the ternary alloy disclosed in the above Publication is not suitable as the antiferromagnetic layer material of the magnetoresistance effect element. if the anticorrosion characteristics are enhanced on the assumption that the magnitude of the coupling magnetic field is allowed to decrease, it is desirable that the same magnitude of the coupling magnetic field as in the case of using a certain binary alloy be obtained from the ternary alloy when this ternary alloy is used for the antiferromagnetic layer, and besides it should exhibit the better anticorrosion characteristics than the binary alloy.

SUMMARY OF THE INVENTION

Accordingly, it is a primary object of the present invention to provide a magnetoresistance effect element including an antiferromagnetic layer composed of a ternary alloy satisfying the above requirements, i.e., a magnetoresistance effect element having a magnetic field detecting performance equal to that of a conventional magnetoresistance effect element with a preference to the magnetic field detecting performance, and an anticorrosion characteristic better than that of the conventional magnetoresistance effect element.

It is another object of the present invention to provide a magnetoresistance effect type head and a magnetic recording/reproducing apparatus that exhibit a superb magnetic field detecting performance and a high durability such as an anticorrosion etc.

As a consequence of having implemented the study with a high concentration in order to obviate the problems given above, the present inventors found it possible to obtain a magnetoresistance effect element, wherein an antiferromagnetic layer is formed of a material consisting of Ir, Rh and Mn in which an Ir content percentage is 2–6% by atom and a Mn content percentage is 71–78% by atom, or a material in which the Ir content percentage is 2–12% by atom and the Mn content percentage is 78–84% by atom, in which case the magnetoresistance effect element has much the same magnitude of a coupling magnetic field as that of the magnetoresistance effect element formed to exhibit the maximum coupling magnetic field by use of an IrMn binary alloy or a RhMn binary alloy, and also exhibits an anticorrosion more excellent than that of the above magnetoresistance effect element, i.e., exhibits the characteristics more superb than those of the conventional magnetoresistance effect element.

Further, the present inventors found it feasible to obtain, by using a material the Rh content percentage of which is 12–16% by atom (i.e., its composition ratio (% by atom) between Ir, Rh and Mn is approximately 6:14:80), a magnetoresistance effect element having the coupling magnetic field a magnitude of which can not be attained by the IrMn binary alloy or the RhMn binary alloy.

Moreover, the present inventions have determined that the magnetoresistance effect element exhibiting particularly an excellent thermal stability could be obtained by setting a thickness of the antiferromagnetic layer to 6–12 nm more preferably 8–10 nm.

Note that the magnetoresistance effect element according to the present invention may be actualized with a construction having only one magnetic layer as well as with a construction having two magnetic layers between which is interposed a non-magnetic layer. In addition, the magnetoresistance effect element according to the present invention may be used as a magnetic field sensor or a sensor unit of a magnetoresistance effect type head.

As described above, the magnetoresistance effect element of the present invention has a large magnitude of the coupling magnetic field between the magnetic layer and the antiferromagnetic layer, and exhibits a high anticorrosion characteristics. Hence, when the magnetoresistance effect type head is constructed by use of this magnetoresistance effect element, it is possible to obtain the magnetoresistance effect type head exhibiting an excellent magnetic field detecting characteristic and a high durability such as an anticorrosion etc. Furthermore, it is feasible to obtain the magnetic recording/reproducing apparatus having a preferable reproducing characteristic and usable stably over a long period of time by using the thus constructed magnetoresistance effect type head.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENT

An illustrative embodiment of the present invention will hereinafter be specifically described with reference to the accompanying drawings.

To start with, there will be explained a content of a test conducted in order to seek out an antiferromagnetic layer material by which a magnetoresistance effect type head exhibiting a more preferable characteristic can be actualized.

The present inventors decided to find out the antiferromagnetic material suitable for use with an antiferromagnetic layer of a magnetoresistance effect element with respect to a ternary alloy consisting of Ir (Iridium), Rh (Rhodium) and Mn (Manganese) (which alloy is hereinafter abbreviated to IrRhMn). Further, as already explained, it is desirable that the antiferromagnetic layer material should exhibit a high performance of the magnetoresistance effect element manufactured, a high thermal stability and a high anticorrosion characteristic. These factors are to be evaluated by use of two kinds of samples each having a different structure.

Figure 1:
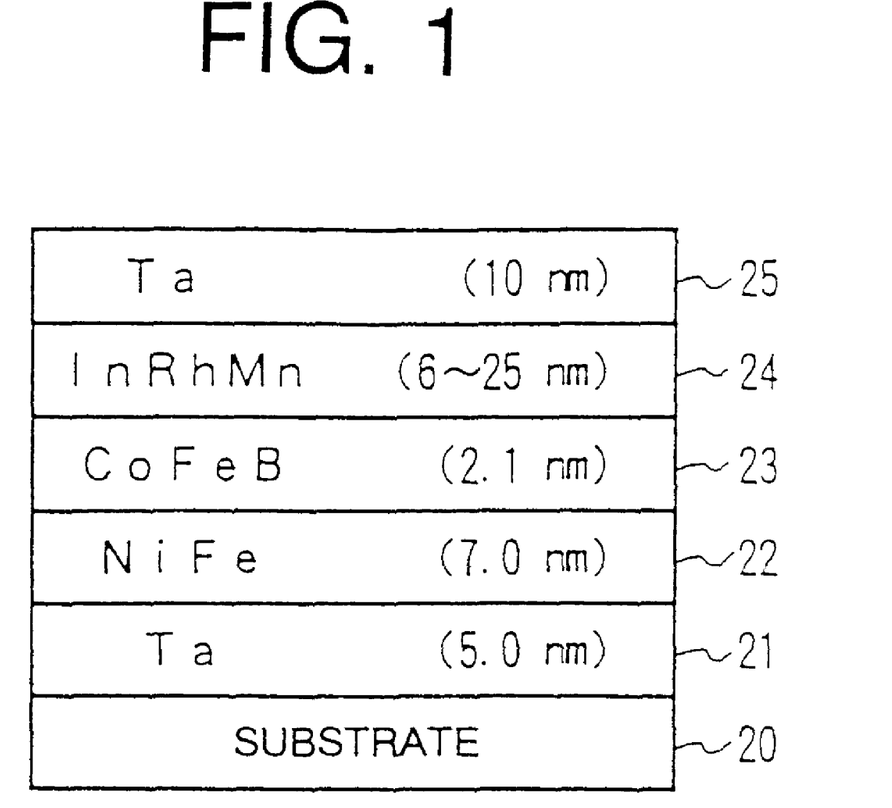
FIG. 1 is an explanatory diagram showing an IrRhMn multi-layered sample used for determining a composition by which a large coupling magnetic field is acquired.

FIG. 1 shows a structure of the sample (hereinafter termed an IrRhMn multi-layered sample) adopted for confirming a magnetic field detecting performance and a thermal stability of a spin valve element (see FIG. 10) using IrRhMn. As shown in FIG. 1, the IrRhMn multi-layered sample has a structure in which a Ta (Tantalum) layer 21, NiFe (Nickel•Iron; Permalloy) layer 22, a CoFeB (Cobalt•Iron•Boron) layer 23, an IrRhMn layer 24 and a Ta layer 25 are laminated on a substrate 20. Note that the Ta layer 21 serves as a buffer layer for growing the NiFe layer 22 to exhibit a desired characteristic, and the Ta layer 25 is a protective layer for making an original characteristic of the IrRhMn layer 24 measurable. The NiFe layer 22 and the CoFeB layer 23 are, when constructed as the spin valve element, magnetic layers functioning as a free layer and a pinned layer, respectively.

According to the present test, a plurality of IrRhMn multi-layered samples having the above structure and different in terms of only compositions and thicknesses of the IrRhMn layers 24, are manufactured by a sputtering method. Manufactured also are a sample including the IrRhMn layer 24 containing no Rh (hereinafter referred to as an IrMn multi-layered sample) and a sample including the IrRhMn layer 24 containing no Ir (hereinafter termed a RhMn multi-layered sample). A sensitivity (a magnetic field detecting performance) of the spin valve element formed is evaluated by measuring a shift quantity (a coupling magnetic field) Hua of a B-H loop of each multi-layered sample. Moreover, an atmospheric temperature dependency etc of Hua is measured, thereby evaluating the thermal stability.

Furthermore, a sample including the substrate formed with an IrRhMn single layer having a variety of compositions (which is hereinafter referred to as an IrRhMn (IrRh, RhMn) single-layered sample) is manufactured as a sample for evaluating the anticorrosion. Then, the anticorrosion is evaluated by measuring a corrosion electric potential (a natural electrode potential) of each single-layered sample by use of a potentiostat.

Figure 2:
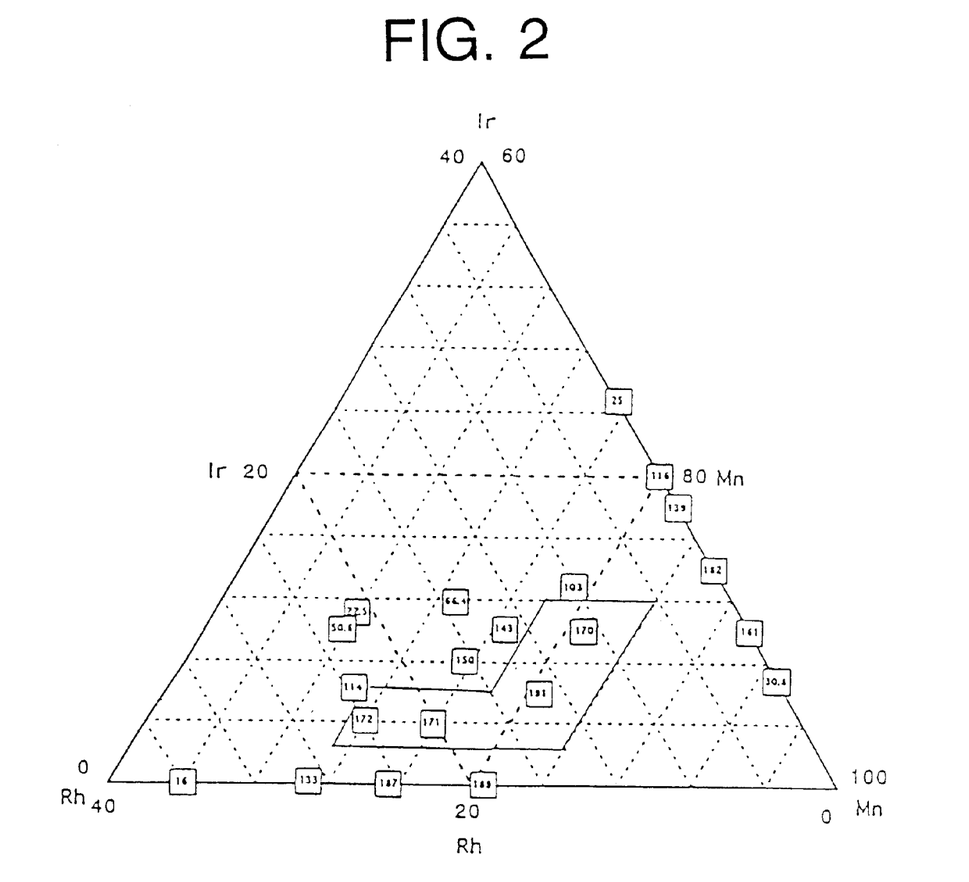
FIG. 2 is a diagram showing a composition dependency of Hua of the IrRhMn multi-layered sample.
Figure 3:
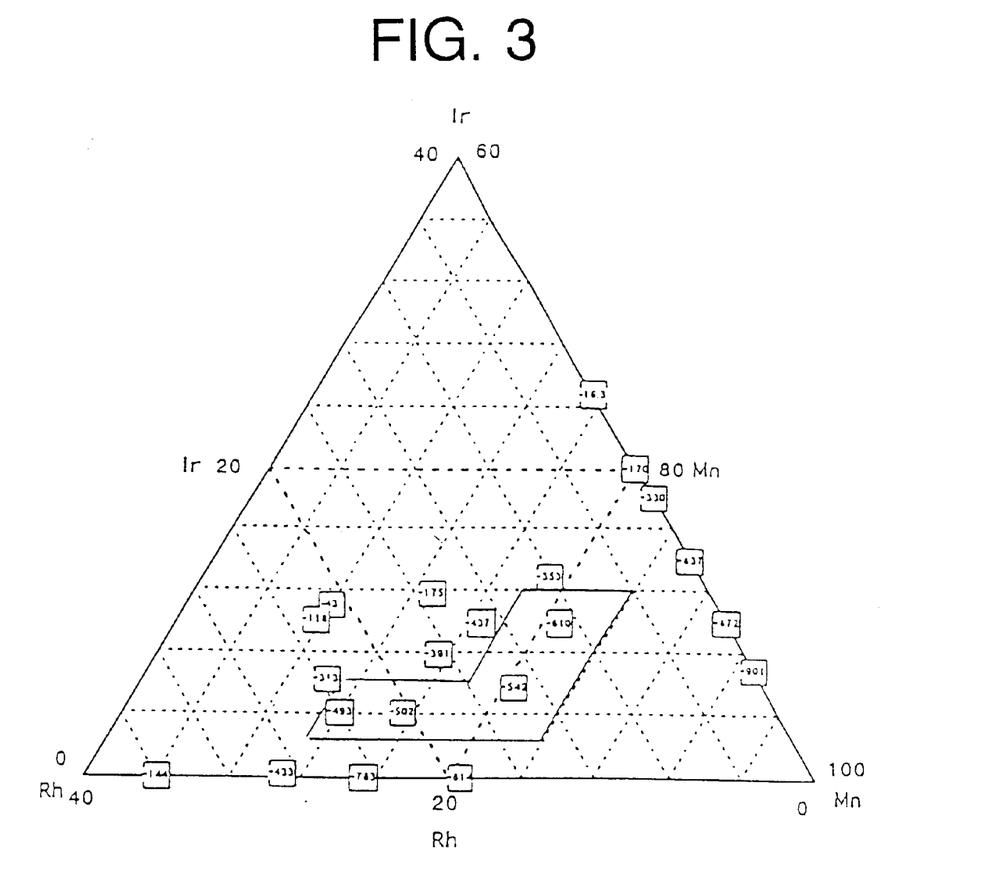
FIG. 3 is a diagram showing a composition dependency of a corrosion electric potential of an IrRhMn single-layered sample.
Figure 4:
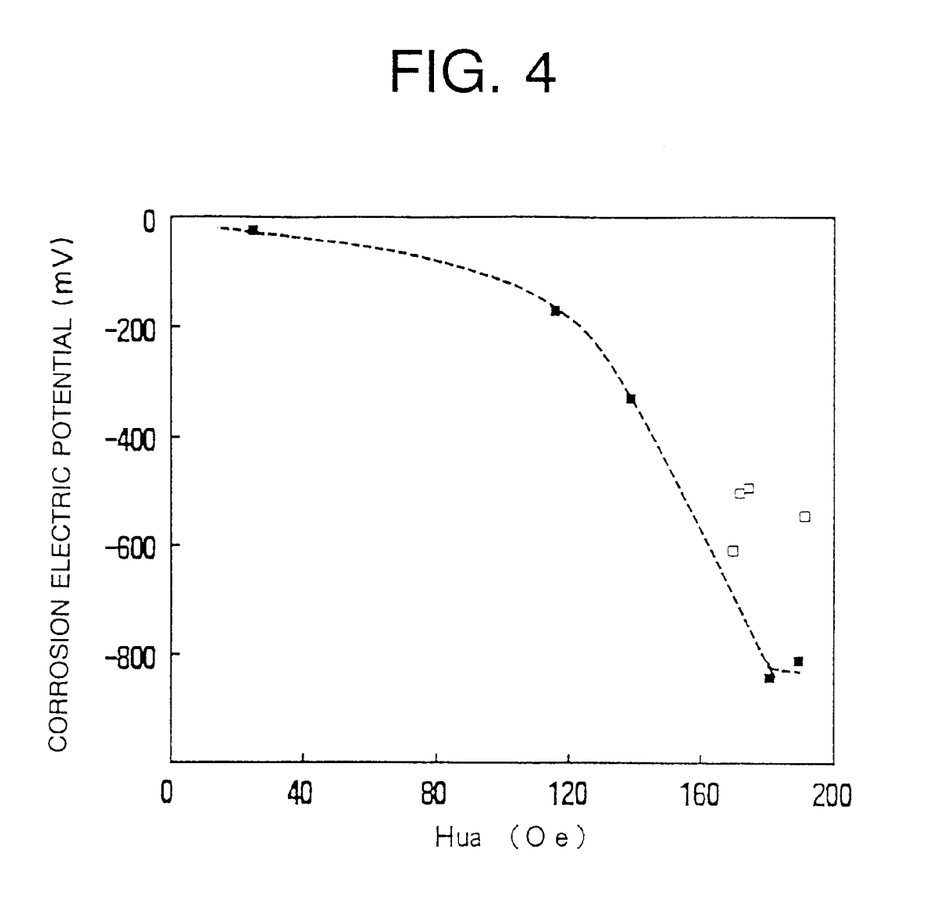
FIG. 4 is a graph showing a relationship between Hua of the IrRhMn sample and the corrosion electric potential.

A result of test will hereinafter be specifically explained with reference to FIGS. 2 to 4. FIG. 2 is a diagram showing a result of measurement of Hua of each multi-layered sample, wherein each numerical value shown therein represents measured Hua (the unit is oersted; Oe) of the multi-layered sample having the composition with an indication of that numerical value. FIG. 3 is a diagram showing a result of measuring a corrosion electric potential of each single-layered sample, wherein each numerical value shown therein represents a measured corrosion electric potential (the unit is mV) of the single-layered sample having a corresponding composition. Note that the material (the composition) capable of obtaining the spin valve element exhibiting a higher magnetic detecting performance shows a larger coupling magnetic field Hua, and the material exhibiting a more excellent anticorrosion shows a larger (more approximate to "0") corrosion electric potential. FIG. 4 is also a diagram showing a relationship between the corrosion electric potential and Hua relative to some samples about which the tests have been conducted.

To begin with, when surveying the result of the measurement of Hua of the multi-layered sample containing no Rh, it can be understood that IrMn is a material having the maximum coupling magnetic field Hua (182 Oe) when a composition ratio (% by atom) of Ir to Mn is approximately 14:86, and also a smaller value of Hua with a bigger difference between its composition ratio and the composition ratio showing the maximum coupling magnetic field Hua.

On the other hand, when surveying a result of measuring the corrosion electric potential of the single-layered sample containing no Rh, it can be recognized that IrMn is a material exhibiting a more excellent anticorrosion with a higher content percentage of Ir.

Similarly, when surveying the result (FIG. 2) of measuring Hua of the sample containing no Ir, it can be understood that RhMn is a material having the maximum coupling magnetic field Hua (189 Oe) when a composition ratio (% by atom) of Rh to Mn is approximately 19:81, and also a smaller value of Hua with a bigger difference between its composition ratio and the composition ratio showing the maximum coupling magnetic field Hua. Further, when surveying the result of measuring the corrosion electric potential of the single-layered sample containing no Rh, it can be recognized that RhMn is a material exhibiting a more excellent anticorrosion with a higher content percentage of Rh.

Moreover, when surveying the result (FIG. 2) of measuring Hua of the IrRhMn multi-layered sample containing all of the three elements, it can be recognized that IrRhMn has Hua exceeding 170 Oe in a composition range indicated by the solid line in the FIG., i.e., the composition range consisting of a composition region in which an Ir content percentage is 2%–6% by atom and a Mn content percentage is 71%–78% by atom, and of a composition region in which the Ir content percentage is 2%–12% by atom and Mn content percentage 78%–84% by atom.

Then, it can be understood from the test result shown in FIG. 3 that IrRhMn in that composition range is more preferable as the antiferromagnetic layer material than IrMn or RhMn.

More specifically, when plotting the corrosion electric potential of the corresponding binary single-layered sample with respect to Hua of the binary multi-layered sample material having each composition, there is obtained a relationship as indicated by black square marks as well as by a dotted line in FIG. 4. Note that there is plotted only the result of the measurement of the sample having a smaller corrosion electric potential if two samples having much the same coupling magnetic field Hua exist in FIG. 4.

As already explained, the material having the larger shift quantity Hua exhibits a more preferable magnetic detecting performance when constructed as the spin valve element, and the material showing the higher corrosion electric potential exhibits the more excellent anticorrosion. Accordingly, it follows that the material, the measurement result of which is plotted on an upper side (a right side) on the basis of the dotted line shown in FIG. 4, is more preferable as the antiferromagnetic layer material. IrRhMn having the composition ratio included in the composition range described above is a material the measurement result of which is, as indicated by white squares in the Figure, all plotted on the upper side (the right side) from the dotted line.

Besides, among the materials falling within the above composition range, the material having a Rh content percentage of 12%–16% by atom (i.e., a material in which a composition ratio (% by atom) between Ir, Rn and Mn is approximately 6:14:80), exhibits a larger shift content Hua (191 Oe) than the maximum value (182 Oe) of Hua that can be attained by the IrMn binary alloy and than the maximum value (189 Oe) of Hua that is attainable by a RhMn binary alloy.

Namely, when the antiferromagnetic layer is formed by using IrRhMn in which the Ir content percentage is 2% –6% by atom and the Mn content percentage is 71%–78% by atom, or IrRhMn in which the Ir content percentage is 2%–12% by atom and the Mn content percentage is 78%–84% by atom, it is feasible to actualize the magnetoresistance effect element with a general characteristic showing a more excellency than the magnetoresistance effect element obtained by forming the antiferromagnetic layer using IrMn and RhMn. When using IrRhMn having a Rh content percentage of 12%–16% by atom (i.e., IrRhMn in which the composition ratio between Ir, Rh and Mn is approximately 6:14:80) particularly in that composition range, Hua comes to 191 Oe, and hence it is feasible to actualize having the more excellent magnetic field detecting performance than the magnetoresistance effect type head using IrMn and RhMn.

Figure 5:
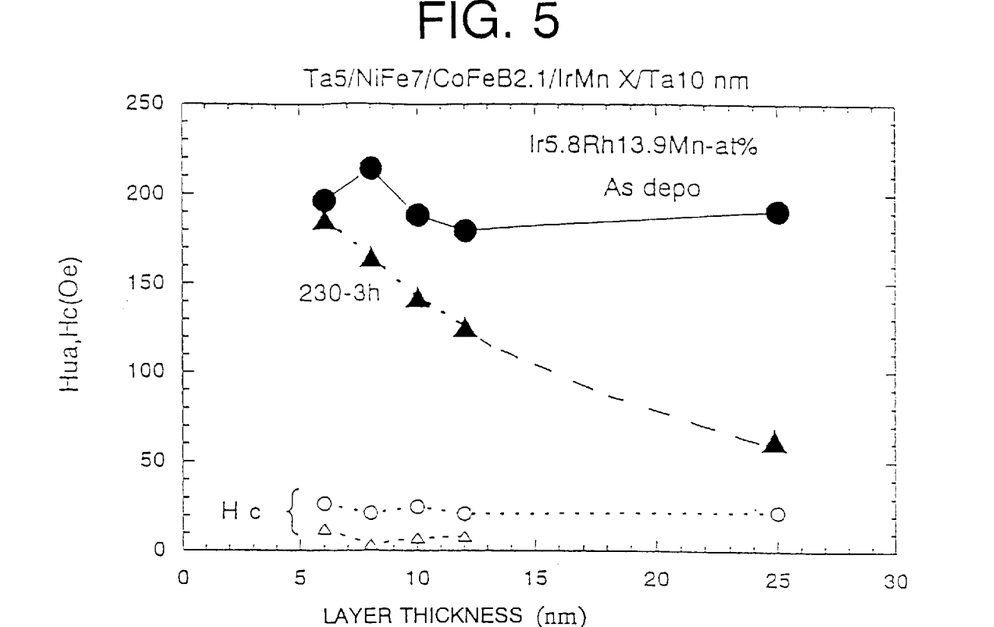
FIG. 5 is a graph showing a layer thickness dependency of each of Hua and Hc of the IrRhMn multi-layered sample.
Figure 6:
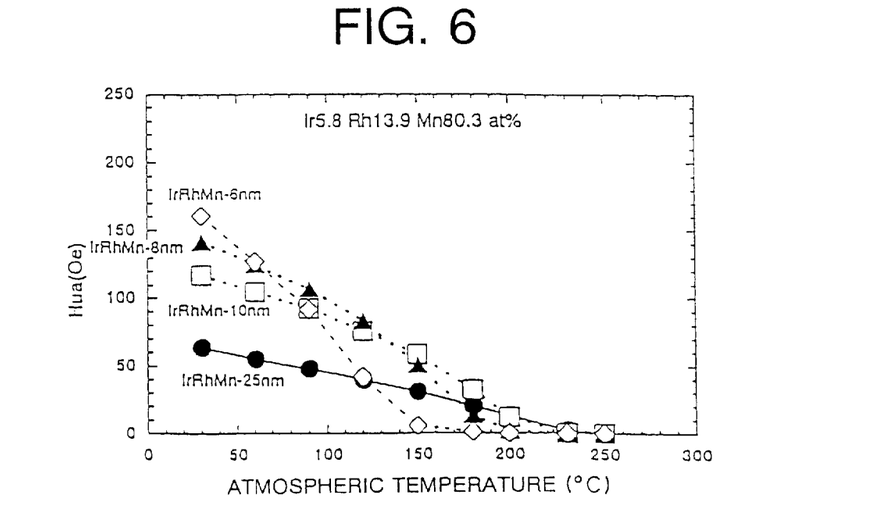
FIG. 6 is a graph showing an atmospheric temperature dependency of Hua of the IrRhMn multi-layered sample.

Next, a result of a test for the thermal stability will be explained with reference to FIGS. 5 and 6. FIG. 5 of these Figures is a graph showing a result of measuring Hua and Hc of the IrRhMn multi-layered sample manufactured with variations in thickness of the IrRhMn layer immediately after the formation thereof and after a 3-hour thermal treatment has been conducted at 230° C. FIG. 6 is also a graph showing a result of measuring an atmospheric temperature dependency of Hua, which has been conducted for obtaining a blocking temperature with respect to the IrRhMn multi-layered sample having the same construction. Note that each graph shows only the result of the test relative to the IrRhMn multi-layered sample in which the composition ratio between Ir, Rh and Mn that are optimal as the antiferromagnetic layer materials, is approximately 6:14:80 (actually measured values are precisely 5.8:13.9:80.3).

As indicated by the black circles in FIG. 5, the IrRhMn multi-layered sample has substantially the same shift quantity Hua in the state immediately after the formation (in which no thermal treatment is implemented) even if the layer thickness is different. As indicated by the black triangles, however, Hua after the 3-hour thermal treatment has been conducted at 230° C. decreases as the thickness of the IrRhMn layer increases. Therefore, the thickness of the IrRhMn layer is preferably 6–12 nm so that Hua after the thermal treatment does not become so small (Hua on the order or 120 Oe or above can be obtained after the thermal treatment).

Further, as shown in FIG. 6, it is confirmed from the result of measuring the atmospheric temperature dependency of Hua that the blocking temperature (at which Hua becomes "0") tends to rise as the thickness of the IrRhMn layer increases, and that the blocking temperature of the multi-layered sample having the IrRhMn layer thickness of 6 nm is 150° C. remarkably lower than blocking temperatures of other multi-layered samples each having a thickness of 8 nm or above. Hence, it can be considered that a preferable thickness of the IrRhMn layer is 8 nm or greater, and it follows that the thickness of the IrRhMn layer is preferably 8–12 nm in terms of the relationship with the layer thickness range determined based on Hua after the thermal treatment described above. Incidentally, the thickness of the IrRhMn layer be particularly 8–10 nm in terms of considering that a Hua decrement quantity due to the thermal treatment becomes smaller as the layer thickness decreases.

As discussed above, it has proved from a series of test results that the magnetoresistance effect element exhibiting particularly the excellent characteristic is obtained by forming the antiferromagnetic layer that is 8–10 nm thick involving the use of IrRhMn in which the composition ratio between Ir, Rh nd Mn is approximately 6:14:80. Therefore, the magnetoresistance effect type head including the spin valve element using IrRhMn having the above composition ratio is actually manufactured, and the magnetic recording/reproducing apparatus mounted with the thus manufactured magnetoresistance effect type head, is manufactured.

Figure 7:
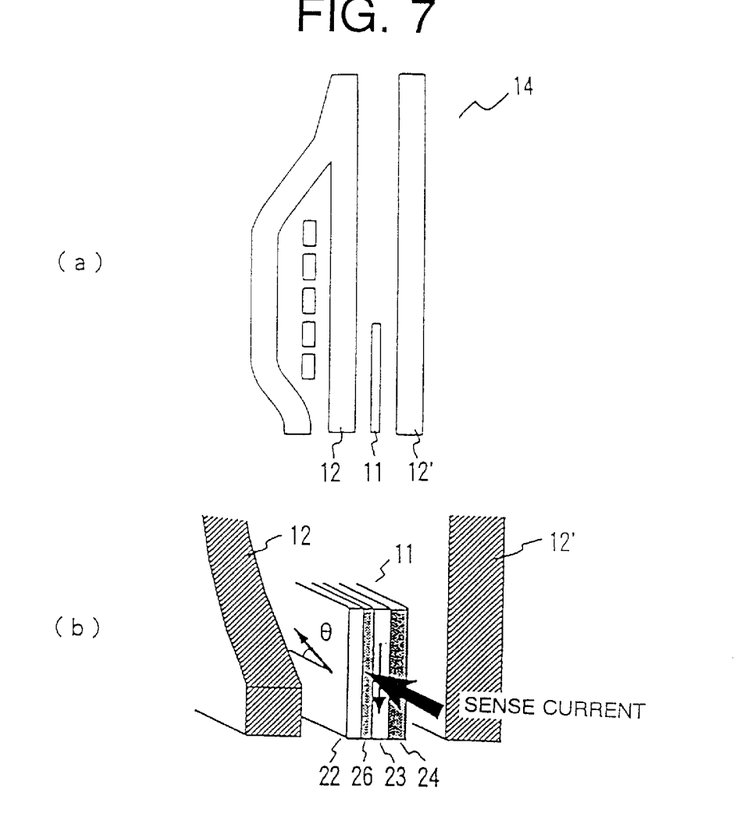
FIG. 7 is a view schematically illustrating a construction of a magnetoresistance effect type head in accordance with one embodiment of the present invention.

FIG. 7 schematically shows a construction of the magnetoresistance effect type head manufactured. Note that referring to FIG. 7, there are omitted illustrations of a slider and of an insulating film interposed between the magnetoresistance effect element and a shield.

Figure 8:
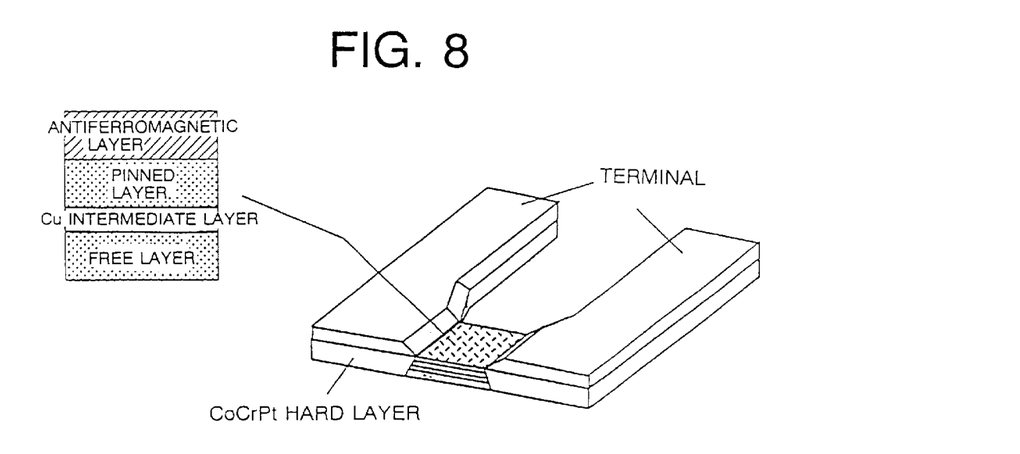
FIG. 8 is a view schematically showing a construction of a magnetoresistance effect element used for the magnetoresistance effect type head shown in FIG. 7.

As shown in FIG. 7(a), a manufactured magnetoresistance effect head 14 is generally known as a marge type head. One shield 12 of a spin valve element (a magnetoresistance effect element) 11 is a head serving as one magnetic pole of a recording head. The spin valve element 11 provided within the magnetoresistance effect type head 14, as illustrated in FIG. 7(b), takes such a form that a Cu intermediate layer 26 is interposed between a NiFe layer 22 and a CoFeB layer 23 of the IrRhMn single-layered sample (see FIG. 1). Note that there is used a spin valve element 11 in which a thickness of the Cu intermediate layer is set to 3 nm, and a thickness of the IrRhMn layer is set to 8 nm, respectively. Further, as illustrated in FIG. 8, there is used the spin valve element 11 provided with a CoCrPt hard layer to control its edge magnetic domain in this embodiment.

Figure 9:
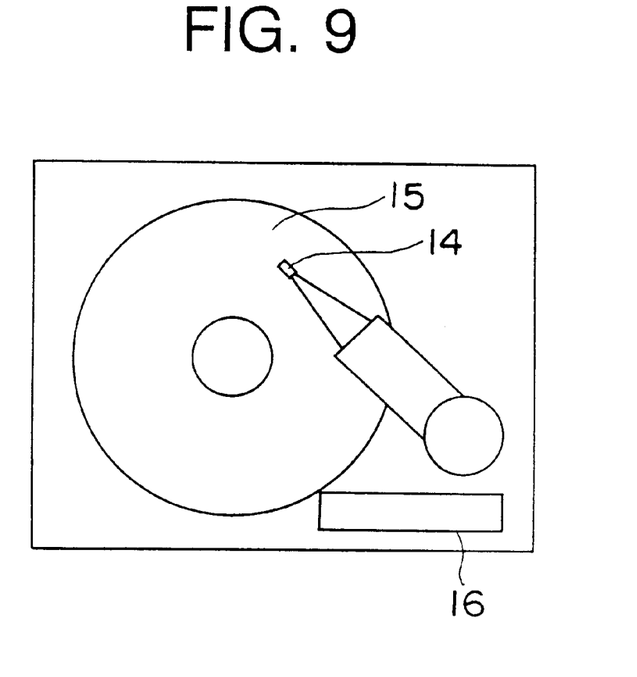
FIG. 9 is a view schematically showing a configuration of a magnetic recording/reproducing apparatus mounted with the magnetoresistance effect type head shown in FIG. 7.

Then, the magnetoresistance effect type head 14 having the above construction is, as shown in FIG. 9, incorporated into a magnetic recording/reproducing apparatus including a magnetic recording medium 15 (a so-called hard disk) and a control system 16, wherein a recording/reproducing characteristic and a durability are evaluated. As a consequence, it could be confirmed that it is possible to execute the recording/reproducing processes in a much better state by using the magnetoresistance effect type head 11 than by using the magnetoresistance effect element containing the antiferromagnetic layer formed of the binary alloy, and that the magnetic recording/reproducing apparatus having a sufficient durability in terms of utility can be constructed.

As fully discussed so far, the magnetoresistance effect element exhibiting the more excellent characteristic than in the prior art can be attained by forming the antiferromagnetic layer using IrRhMn the composition ratio of which falls within the above-described range. Then, the magnetoresistance effect type head and the magnetic recording/reproducing apparatus, which show the more superb characteristic than in the prior art, can be constructed by using the magnetoresistance effect element.

Note that the magnetoresistance effect element in this embodiment is the so-called spin valve element including the two magnetic layer between which the non-magnetic layer is interposed, and the antiferromagnetic layer formed on one of those magnetic layers. When forming the antiferromagnetic layer of the magnetoresistance effect element taking such a form as to include one magnetic layer, as a matter of course, IrRhMn within the composition range described above may be employed. Moreover, it is taken for granted that the present magnetoresistance effect element may be used not as a component of the magnetoresistance effect type head but as a magnetic field sensor.

It is apparent that, in this invention, a wide range of different working modes can be formed based on the invention without deviating from the spirit and scope of the invention. This invention is not restricted by its specific working modes except being limited by the appended claims.

What is claimed is:

1. A magnetoresistance effect element comprising:

a magnetic layer; and an antiferromagnetic layer composed of a material made of Ir, Rh and Mn in which an Ir content percentage is 2–6% by atom and the Mn content percentage is 71–78% by atom, and the Rh content percentage is 16–27% by atom.

2. A magnetoresistance effect element according to claim 1, wherein a Rh content percentage of the material constituting said antiferromagnetic layer is 12–16% by atom.

3. A magnetoresistance effect element according to claim 2, wherein a thickness of said antiferromagnetic layer is 6–12 nm.

4. A magnetoresistance effect element according to claim 3, wherein a thickness of said antiferromagnetic layer is 8–10 nm.

5. A magnetoresistance effect head comprising:

a magnetoresistance effect element according to any one of claims 1 to 4.

6. A magnetic recording/reproducing apparatus comprising:

a magnetoresistance effect head including a magnetoresistance effect element according to any one of claims 1 to 4.

7. A magneto resistance effect element comprising:

a magnetic layer; and an antiferromagnetic layer is composed of a material made of Ir, Rh and Mn in which an Ir content percentage is 2–12% by atom, a Mn content percentage is 78–84% by atom, and a Rh content percentage is 4–20% by atom.

* * * * *